(12) United States Patent
Cok

(10) Patent No.: US 9,799,719 B2
(45) Date of Patent: Oct. 24, 2017

(54) ACTIVE-MATRIX TOUCHSCREEN

(71) Applicant: X-Celeprint Limited, Cork (IE)

(72) Inventor: Ronald S. Cok, Rochester, NY (US)

(73) Assignee: X-Celeprint Limited, Lee Maltings, Dyke Parade, Cork (IE)

( * ) Notice: Subject to any disclaimer, the term of this patent is extended or adjusted under 35 U.S.C. 154(b) by 0 days.

(21) Appl. No.: 14/795,831

(22) Filed: Jul. 9, 2015

(65) Prior Publication Data

US 2017/0010706 A1    Jan. 12, 2017

(51) Int. Cl.

| | |
|---|---|
| G06F 3/041 | (2006.01) |
| G06F 3/044 | (2006.01) |
| H01L 27/32 | (2006.01) |
| H01L 33/58 | (2010.01) |
| H01L 33/62 | (2010.01) |
| H01L 25/04 | (2014.01) |
| H01L 25/075 | (2006.01) |
| H01L 27/15 | (2006.01) |
| H01L 33/64 | (2010.01) |
| H01L 51/52 | (2006.01) |
| H01L 51/56 | (2006.01) |

(52) U.S. Cl.
CPC .......... *H01L 27/3293* (2013.01); *G06F 3/044* (2013.01); *G06F 3/0416* (2013.01); *H01L 25/048* (2013.01); *H01L 25/0753* (2013.01); *H01L 27/156* (2013.01); *H01L 27/3276* (2013.01); *H01L 27/3288* (2013.01); *H01L 33/58* (2013.01); *H01L 33/62* (2013.01); *H01L 33/64* (2013.01); *H01L 51/529* (2013.01); *H01L 51/56* (2013.01); *H01L 2227/326* (2013.01); *H01L 2933/0066* (2013.01); *H01L 2933/0075* (2013.01)

(58) Field of Classification Search
CPC .............................. G06F 3/044; G06F 3/0412
See application file for complete search history.

(56) References Cited

U.S. PATENT DOCUMENTS

| | | |
|---|---|---|
| 5,621,555 A | 4/1997 | Park |
| 5,815,303 A | 9/1998 | Berlin |
| 6,278,242 B1 | 8/2001 | Cok et al. |
| 6,577,367 B2 | 6/2003 | Kim |
| 6,717,560 B2 | 4/2004 | Cok et al. |

(Continued)

FOREIGN PATENT DOCUMENTS

WO    WO-2008/103931 A2    8/2008

OTHER PUBLICATIONS

"Projected Capacitive Technology" 2013, 3M Company.*

(Continued)

*Primary Examiner* — Benjamin C Lee
*Assistant Examiner* — Dong Hui Liang
(74) *Attorney, Agent, or Firm* — William R. Haulbrook; Alexander D. Augst; Choate, Hall and Stewart LLP

(57) ABSTRACT

An active-matrix touchscreen includes a substrate, a system controller, and a plurality of spatially separated independent touch elements disposed on the substrate. Each touch element includes a touch sensor and a touch controller circuit that provides one or more sensor-control signals to the touch sensor and receives a sense signal responsive to the sensor-control signals from the touch sensor. Each touch sensor operates independently of any other touch sensor.

12 Claims, 10 Drawing Sheets

(56) References Cited

U.S. PATENT DOCUMENTS

| | | |
|---|---|---|
| 6,756,576 B1 | 6/2004 | McElroy et al. |
| 6,933,532 B2 | 8/2005 | Arnold et al. |
| 7,129,457 B2 | 10/2006 | McElroy et al. |
| 7,195,733 B2 | 3/2007 | Rogers et al. |
| 7,288,753 B2 | 10/2007 | Cok |
| 7,521,292 B2 | 4/2009 | Rogers et al. |
| 7,557,367 B2 | 7/2009 | Rogers et al. |
| 7,586,497 B2 | 9/2009 | Boroson et al. |
| 7,622,367 B1 | 11/2009 | Nuzzo et al. |
| 7,662,545 B2 | 2/2010 | Nuzzo et al. |
| 7,704,684 B2 | 4/2010 | Rogers et al. |
| 7,799,699 B2 | 9/2010 | Nuzzo et al. |
| 7,816,856 B2 | 10/2010 | Cok et al. |
| 7,893,612 B2 | 2/2011 | Cok |
| 7,927,976 B2 | 4/2011 | Menard |
| 7,932,123 B2 | 4/2011 | Rogers et al. |
| 7,943,491 B2 | 5/2011 | Nuzzo et al. |
| 7,972,875 B2 | 7/2011 | Rogers et al. |
| 7,982,296 B2 | 7/2011 | Nuzzo et al. |
| 7,999,454 B2 | 8/2011 | Winters et al. |
| 8,029,139 B2 | 10/2011 | Ellinger et al. |
| 8,039,847 B2 | 10/2011 | Nuzzo et al. |
| 8,198,621 B2 | 6/2012 | Rogers et al. |
| 8,207,547 B2 | 6/2012 | Lin |
| 8,243,027 B2 | 8/2012 | Hotelling et al. |
| 8,261,660 B2 | 9/2012 | Menard |
| 8,334,545 B2 | 12/2012 | Levermore et al. |
| 8,394,706 B2 | 3/2013 | Nuzzo et al. |
| 8,440,546 B2 | 5/2013 | Nuzzo et al. |
| 8,470,701 B2 | 6/2013 | Rogers et al. |
| 8,502,192 B2 | 8/2013 | Kwak et al. |
| 8,506,867 B2 | 8/2013 | Menard |
| 8,664,699 B2 | 3/2014 | Nuzzo et al. |
| 8,686,447 B2 | 4/2014 | Tomoda et al. |
| 8,722,458 B2 | 5/2014 | Rogers et al. |
| 8,754,396 B2 | 6/2014 | Rogers et al. |
| 8,766,970 B2 | 7/2014 | Chien et al. |
| 8,791,474 B1 | 7/2014 | Bibl et al. |
| 8,794,501 B2 | 8/2014 | Bibl et al. |
| 8,803,857 B2 | 8/2014 | Cok |
| 8,817,369 B2 | 8/2014 | Daiku |
| 8,854,294 B2 | 10/2014 | Sakariya |
| 8,877,648 B2 | 11/2014 | Bower et al. |
| 8,889,485 B2 | 11/2014 | Bower |
| 8,895,406 B2 | 11/2014 | Rogers et al. |
| 8,987,765 B2 | 3/2015 | Bibl et al. |
| 2008/0055260 A1* | 3/2008 | Posamentier ........... G06F 3/041 345/173 |
| 2008/0225008 A1* | 9/2008 | Madonna .............. G06F 3/0488 345/173 |
| 2009/0040191 A1* | 2/2009 | Tong ...................... G06F 3/044 345/174 |
| 2009/0160822 A1* | 6/2009 | Eguchi .................... G06F 3/044 345/174 |
| 2009/0267903 A1* | 10/2009 | Cady ..................... G06F 3/0416 345/173 |
| 2010/0060553 A1* | 3/2010 | Zimmerman ....... H01L 25/0753 345/60 |
| 2010/0214247 A1 | 8/2010 | Tang et al. |
| 2010/0248484 A1 | 9/2010 | Bower et al. |
| 2010/0283765 A1* | 11/2010 | Gotoh .................... G06F 3/042 345/175 |
| 2012/0038561 A1* | 2/2012 | Han ...................... G06F 3/0416 345/173 |
| 2012/0228669 A1 | 9/2012 | Bower et al. |
| 2012/0314388 A1 | 12/2012 | Bower et al. |
| 2013/0069275 A1 | 3/2013 | Menard et al. |
| 2013/0088416 A1 | 4/2013 | Smith et al. |
| 2013/0196474 A1 | 8/2013 | Meitl et al. |
| 2013/0207964 A1 | 8/2013 | Fleck et al. |
| 2013/0221355 A1 | 8/2013 | Bower et al. |
| 2013/0273695 A1 | 10/2013 | Menard et al. |
| 2014/0104243 A1 | 4/2014 | Sakariya et al. |
| 2014/0264763 A1 | 9/2014 | Meitl et al. |
| 2014/0267683 A1 | 9/2014 | Bibl et al. |
| 2014/0367633 A1 | 12/2014 | Bibl et al. |
| 2015/0049041 A1* | 2/2015 | Yousefpor ............. G06F 3/0412 345/174 |
| 2015/0135525 A1 | 5/2015 | Bower |
| 2015/0137153 A1 | 5/2015 | Bibl et al. |
| 2015/0185930 A1* | 7/2015 | Xu ........................ G06F 3/0412 345/173 |

OTHER PUBLICATIONS

Roscher, H., VCSEL Arrays with Redundant Pixel Designs for 10Gbits/s 2-D Space-Parallel MMF Transmission, Annual Report, optoelectronics Department, (2005).

Yaniv et al., A 640×480 Pixel Computer Display Using Pin Diodes with Device Redundancy, 1988 International Display Research Conference, IEEE, CH-2678-1/88:152-154 (1988).

* cited by examiner

ACTIVE-MATRIX TOUCHSCREEN

CROSS REFERENCE TO RELATED APPLICATIONS

Reference is made to U.S. patent application Ser. No. 14/754,573 filed Jun. 29, 2015, entitled Small Aperture Ratio Display with Electrical Component, U.S. Patent Application Ser. No. 62/055,472 filed Sep. 25, 2014, entitled Compound Micro-Assembly Strategies and Devices, and U.S. patent application Ser. No. 14/743,981 filed Jun. 18, 2015 and entitled Micro-Assembled Micro LED Displays and Lighting Elements, the contents of each of which is incorporated by reference herein in its entirety.

FIELD OF THE INVENTION

The present invention relates to a touchscreen and to a display incorporating such a touchscreen.

BACKGROUND OF THE INVENTION

Flat-panel displays are widely used in conjunction with computing devices, in portable devices, and for entertainment devices such as televisions. Such displays typically employ a plurality of pixels distributed over a display substrate to display images, graphics, or text. In a color display, each pixel includes light emitters that emit light of different colors, such as red, green, and blue. For example, liquid crystal displays (LCDs) employ liquid crystals to block or transmit light from a backlight behind the liquid crystals and organic light-emitting diode (OLED) displays rely on passing current through a layer of organic material that glows in response to the current.

Many display systems, particularly for displays used in mobile applications such as tablet computers and smartphones, include a touchscreen that responds to commands provided by touching the touchscreen. A variety of touchscreen technologies are known, for example resistive, optical, acoustic, inductive, and capacitive.

Touchscreens are typically located over a display and use separate substrates and covers. Such an arrangement adds thickness and weight to a display system and absorbs light emitted by the display. In recent years, touchscreen components have been formed on display components, for example display covers, reducing the thickness and weight of the display system. For example, U.S. Pat. No. 8,243,027 describes a variety of touchscreen structures in a liquid crystal display having a backlight and color filters. U.S. Patent Application Publication No. 2010/0214247 discloses an array of touch elements including first and second electrodes forming in a plurality of two-dimensionally arranged capacitive sensing units in a layer.

In general, touch screens are either single-touch or multi-touch. Single-touch systems can detect only one touch at a time, for example most resistive touchscreens are of this type. Such screens are typically simple, fast, robust, easy to use with a variety of implements, and inexpensive to control and operate. In contrast, multi-touch touchscreens, for example self-capacitive or mutual-capacitive touch sensors, can detect multiple touch points on a screen at a time but are more limited in their touch modalities, for example limited to touches with a conductive stylus, such as a human finger. Such multi-touch systems use a matrix of touch sensors and are typically controlled using a sequential matrix scanning technique. For example, a mutual-capacitance touch system includes orthogonal arrays of horizontal and vertical overlapping electrodes. At every location where the horizontal and vertical electrodes overlap, a capacitor is formed, providing a capacitive touch sensor. A touch controller drives a row of touch sensors at a time and then reads a sense signal from each of the columns. Thus, only one row of sensors can be activated and read at a time. The touch controller sequentially drives successive rows to read back a signal from each touch sensor in the array. Because the rows of touch sensors are sequentially activated, as the touch sensor array grows larger and includes more rows, the rate at which the touch sensor array can be controlled decreases. This limits either the size (number of touch sensors in the touchscreen) or the scan rate at which touches can be detected, or both. Furthermore, touches in different rows are detected at different times. Such a control scheme is similar to the passive-matrix control used in small displays, for example small LCDs or OLED displays.

There remains a need, therefore, for alternative touchscreen structures that provide improved functionality and multi-touch capability and increased size and scan rates.

SUMMARY OF THE INVENTION

The present invention includes an array of independent touch elements each including a touch controller circuit associated with a corresponding touch sensor. Each of the touch sensors is independent and can be activated or sensed by the touch controller circuit independently of any other touch sensor in the array at any time. Such a system can be considered to be an active-matrix touchscreen since each touch element includes an active circuit, for example a transistor circuit.

Active-matrix displays are commonly designed with thin-film transistors (TFTs) in a semiconductor layer formed over a glass display substrate and employ a separate TFT circuit to control each light-emitting pixel in the display. The semiconductor layer is typically amorphous silicon or polycrystalline silicon and is distributed over the entire flat-panel display substrate. Thin-film transistor structures are relatively large and slow compared to the crystalline silicon typically found in computing circuits. Moreover both LCD and OLED displays use high-aperture ratio designs to fill as much of the display substrate area as possible with light emitting material. Hence, the use of relatively complex circuits at each pixel location in a prior-art LCD or OLED display is problematic, since there is little or no space on the substrate for circuits and any such thin-film circuit is large and slow.

According to embodiments of the present invention, an active-matrix touch screen includes small crystalline semiconductor circuits that are each associated with an independent touch sensor and that can be micro transfer printed onto a substrate and electrically interconnected using electrical conductors photolithographically formed on the substrate. The crystalline semiconductor circuits are much smaller, more complex, and faster than thin-film circuits and provide circuits for controlling, analyzing, and communicating touches associated with a local independent touch sensor. The circuits can be interspersed between pixel elements in a display, for example a micro-light-emitting diode (micro-LED) with a small aperture ratio, to form an integrated display-and-touchscreen system constructed and controlled on a single substrate. The small micro-LED pixels provide space on the substrate for touch circuits and the small crystalline semiconductors can provide effective, small, and high-performance circuits for enabling touch sensing.

Embodiments of the present invention provide a thin, single-substrate, integrated display-and-touchscreen system with improved performance and reduced size and thickness. The system can support simultaneous multi-touch across display substrates at an increased data rate for larger displays.

In one aspect, the disclosed technology includes an active-matrix touchscreen, including: a substrate; a system controller; a plurality of spatially separated independent touch elements disposed on the substrate, each touch element including: a touch sensor; and a touch controller circuit for providing one or more sensor-control signals to the touch sensor and for receiving a sense signal responsive to the one or more sensor-control signals from the touch sensor, wherein each touch sensor operates independently of any other touch sensor of the plurality of touch elements.

In certain embodiments, each touch element transmits a touch signal to the system controller independently of any other touch element of the plurality of touch elements in response to a respective detected touch.

In certain embodiments, each touch controller circuit operates independently of any other touch controller circuit of the plurality of touch elements.

In certain embodiments, the plurality of spatially separated independent touch elements comprises 10,000 or more independent touch elements, 50,000 or more independent touch elements, 100,000 or more independent touch elements, 500,000 or more independent touch elements, or 1,000,000 or more independent touch elements.

In certain embodiments, the one or more sensor-control signals comprise a touch sensor drive signal and a touch sensor sense signal.

In certain embodiments, each touch element comprises a touch analysis circuit that analyzes the sense signal to determine a touch.

In certain embodiments, the touch sensor is a capacitive touch sensor, an optical touch sensor, an acoustic touch sensor, an inductive touch sensor, a piezo-electric sensor, or a resistive touch sensor.

In certain embodiments, the touch sensor is a capacitive touch sensor and comprises one or more capacitors, each of the one or more capacitors connected to the touch controller of the respective touch element.

In certain embodiments, the capacitors are formed on the substrate.

In certain embodiments, the touch sensor is a self-capacitive touch sensor.

In certain embodiments, the touch sensor is a mutual-capacitive touch sensor having at least two electrical conductors.

In certain embodiments, the two electrical conductors are interdigitated.

In certain embodiments, the two electrical conductors are both electrically connected to a common touch controller circuit of the plurality of touch controller circuits.

In certain embodiments, the two electrical conductors comprise a first electrical conductor electrically connected to a first touch controller circuit of the plurality of touch controller circuits and a second electrical conductor different from the first electrical conductor electrically connected to a second touch controller circuit of the plurality of touch controller circuits different from the first touch controller circuit.

In certain embodiments, the first touch controller circuit is connected to a first touch sensor of the plurality of touch sensors and to a second touch sensor of the plurality of touch sensors different from the first touch sensor.

In certain embodiments, the first and second touch sensors are arranged on opposite sides of the first touch controller.

In certain embodiments, the touch sensor is an optical touch sensor and the optical touch sensor comprises a light-sensitive semiconductor diode.

In certain embodiments, the touchscreen includes light-emitting elements located on the substrate.

In certain embodiments, the touch elements are connected.

In certain embodiments, each touch element is connected to at least one neighboring touch element.

In certain embodiments, the touch elements each include a touch transmission circuit responsive to an interrogation signal from the system controller.

In certain embodiments, the touch elements each comprise a touch transmission circuit that independently provides a touch signal to the system controller.

In certain embodiments, at least some of the touch elements are connected in a row and column matrix.

In certain embodiments, at least a portion of the plurality of touch elements are connected in a daisy chain.

In certain embodiments, the substrate is a backplane substrate and the touch elements are disposed on one or more touch substrates different from the backplane substrate.

In certain embodiments, the substrate is a backplane substrate and wherein the touch controller circuits are disposed on one or more touch substrates different from the backplane substrate and the touch sensors are disposed on the backplane substrate.

In certain embodiments, the touch substrates each comprise one or more light emitters.

In certain embodiments, the touch controller is connected to two or more touch sensors.

In certain embodiments, a touch element comprises touch transmission circuits for receiving a communication from a first touch element and communicating the communication to a second, different touch element.

In certain embodiments, a touch element comprises double-buffering circuitry to communicate a first touch at a first time to the system controller and simultaneously sense a second touch at a second time after the first time.

In certain embodiments, the substrate is a member selected from the group consisting of polymer, plastic, resin, polyimide, PEN, PET, metal, metal foil, glass, a semiconductor, and sapphire.

In certain embodiments, each of the plurality of light emitters has with at least one of a length, width, and height from 2 to 5 µm, 4 to 10 µm, 10 to 20 µm, or 20 to 50 µm.

In certain embodiments, the substrate has a transparency greater than or equal to 50%, 80%, 90%, or 95% for visible light.

In certain embodiments, the plurality of spatially separated independent touch elements are disposed on the substrate via micro transfer printing.

In certain embodiments, the plurality of touch elements have a resolution of greater than or equal to 10 touch sensors per inch, greater than or equal to 20 touch sensors per inch, greater than or equal to 50 touch sensors per inch, greater than or equal to 75 touch sensors per inch, greater than or equal to 100 touch sensors per inch, greater than or equal to 200 touch sensors per inch, or greater than or equal to 400 touch sensors per inch.

In certain embodiments, at least one dimension of the substrate area over which the touch sensors are disposed is greater than or equal to 10 inches, 12 inches, 15 inches, 20 inches, 24 inches, 32 inches, 44 inches, 55 inches, 65 inches, 72 inches, 80 inches, 100 inches, or 110 inches.

In certain embodiments, at least one dimension of the touch sensors is less than or equal to 0.1 inches, 0.08 inches, 0.06 inches, 0.05 inches, 0.033 inches, 0.025, 0.020, 0.015, or 0.01 inches.

In certain embodiments, at least two orthogonal dimensions of the touch sensors are both less than or equal to 0.1 inches, 0.08 inches, 0.06 inches, 0.05 inches, 0.033 inches, 0.025, 0.020, 0.015, or 0.01 inches.

In certain embodiments, the substrate has a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm.

In certain embodiments, the active-matrix touchscreen has a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm.

In another aspect, the disclosed technology includes a display incorporating an active-matrix touchscreen, including: a substrate; a system controller; a plurality of spatially separated independent light-emitting pixels disposed on the substrate; a plurality of spatially separated independent touch elements disposed on the substrate, each touch element including: a touch sensor; and a touch controller circuit for providing one or more sensor-control signals to the touch sensor and for receiving a sense signal responsive to the one or more sensor-control signals from the touch sensor, wherein each touch sensor operates independently of any other touch sensor of the plurality of touch elements.

In certain embodiments, each touch element transmits a touch signal to the system controller independently of any other touch element of the plurality of touch elements in response to a respective detected touch.

In certain embodiments, each touch controller circuit operates independently of any other touch controller circuit of the plurality of touch elements.

In certain embodiments, the plurality of spatially separated independent touch elements comprises 10,000 or more independent touch elements, 50,000 or more independent touch elements, 100,000 or more independent touch elements, 500,000 or more independent touch elements, or 1,000,000 or more independent touch elements.

In certain embodiments, the one or more sensor-control signals comprise a touch sensor drive signal and a touch sensor sense signal.

In certain embodiments, each touch element comprises a touch analysis circuit that analyzes the sense signal to determine a touch.

In certain embodiments, the touch sensor is a capacitive touch sensor, an optical touch sensor, an acoustic touch sensor, an inductive touch sensor, a piezo-electric sensor, or a resistive touch sensor.

In certain embodiments, the touch sensor is a capacitive touch sensor and comprises one or more capacitors, each of the one or more capacitors connected to the touch controller of the respective touch element.

In certain embodiments, the capacitors are formed on the substrate.

In certain embodiments, the touch sensor is a self-capacitive touch sensor.

In certain embodiments, the touch sensor is a mutual-capacitive touch sensor having at least two electrical conductors.

In certain embodiments, the two electrical conductors are interdigitated.

In certain embodiments, the two electrical conductors are both electrically connected to a common touch controller of the plurality of touch controllers.

In certain embodiments, the two electrical conductors comprise a first electrical conductor electrically connected to a first touch controller of the plurality of touch controllers and a second electrical conductor different from the first electrical conductor electrically connected to a second touch controller of the plurality of touch controllers different from the first touch controller.

In certain embodiments, the first touch controller is connected to a first touch sensor of the plurality of touch sensors and to a second touch sensor of the plurality of touch sensors different from the first touch sensor.

In certain embodiments, the first and second touch sensors are arranged on opposite sides of the first touch controller.

In certain embodiments, the touch sensor is an optical touch sensor and the optical touch sensor comprises a light-sensitive semiconductor diode.

In certain embodiments, the touch elements are connected.

In certain embodiments, each touch element is connected to at least one neighboring touch element.

In certain embodiments, the touch elements each comprise a touch transmission circuit responsive to an interrogation signal from the system controller.

In certain embodiments, the touch elements each comprise a touch transmission circuit that independently provides a touch signal to the system controller.

In certain embodiments, at least some of the touch elements are connected in a row and column matrix.

In certain embodiments, at least a portion of the plurality of touch elements are connected in a daisy chain.

In certain embodiments, the substrate is a backplane substrate and the touch elements are disposed on one or more touch substrates different from the backplane substrate.

In certain embodiments, the substrate is a backplane substrate and wherein the touch controller circuits are disposed on one or more touch substrates different from the backplane substrate and the touch sensors are disposed on the backplane substrate.

In certain embodiments, the touch substrate is also a pixel substrate and the light-emitting pixels are located on the pixel substrate or comprising an active-matrix pixel controller circuit associated with each pixel and wherein the pixel controller circuit is located on the pixel substrate.

In certain embodiments, the substrate is a backplane substrate and comprising a pixel substrate different from the backplane substrate.

In certain embodiments, the light-emitting pixels are located on the pixel substrate.

In certain embodiments, the display includes an active-matrix pixel controller circuit associated with each pixel and wherein the pixel controller circuit is located on the pixel substrate.

In certain embodiments, the light-emitting pixels are located on the backplane substrate.

In certain embodiments, the each light-emitting pixel comprises one or more light emitters.

In certain embodiments, the light emitters comprise inorganic light emitting diodes.

In certain embodiments, each of the light emitters has a width from 2 to 5 μm, 5 to 10 μm, 10 to 20 μm, or 20 to 50 μm.

In certain embodiments, each of the light emitters has a length from 2 to 5 µm, 5 to 10 µM, 10 to 20 µm, or 20 to 50 µm.

In certain embodiments, each of the light emitters has with a height from 2 to 5 µm, 4 to 10 µm, 10 to 20 µm, or 20 to 50 µm.

In certain embodiments, the display substrate has a contiguous display substrate area, the plurality of light emitters each have a light-emissive area, and the combined light-emissive areas of the plurality of light emitters is less than or equal to one-quarter of the contiguous display substrate area.

In certain embodiments, the combined light-emissive areas of the plurality of light emitters is less than or equal to one eighth, one tenth, one twentieth, one fiftieth, one hundredth, one five-hundredth, one thousandth, one two-thousandth, or one ten-thousandth of the contiguous display substrate area.

In certain embodiments, the display has a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm.

In certain embodiments, display substrate has a transparency greater than or equal to 50%, 80%, 90%, or 95% for visible light.

In certain embodiments, the display substrate is a member selected from the group consisting of polymer, plastic, resin, polyimide, PEN, PET, metal, metal foil, glass, a semiconductor, and sapphire.

In another aspect, the disclosed technology includes a display, including: a substrate; a plurality of light emitters disposed exclusively on the substrate; and a plurality of touch sensors exclusively on the substrate, wherein the plurality of light emitters and the plurality of touch sensors are disposed on a common surface of the substrate.

In certain embodiments, the touch sensors are interspersed between the light emitters over the substrate.

In certain embodiments, the display comprises an array of touch controller circuits disposed over the substrate, each touch controller circuit associated with, connected to, and controlling one or more of the touch sensors.

In certain embodiments, the touch sensors are on a common plane with the light emitters.

In certain embodiments, the touch sensors do not absorb light emitted by the light emitters.

In certain embodiments, the display includes a plurality of spatially separated independent touch elements disposed on the substrate, each touch element including: a touch sensor of the plurality of touch sensors; and a touch controller circuit for providing one or more sensor-control signals to the touch sensor and for receiving a sense signal responsive to the one or more sensor-control signals from the touch sensor, wherein each touch sensor operates independently of any other touch sensor of the plurality of touch elements.

In certain embodiments, each touch element transmits a touch signal to the system controller independently of any other touch element of the plurality of touch elements in response to a respective detected touch.

In certain embodiments, each touch controller circuit operates independently of any other touch controller circuit of the plurality of touch elements.

In certain embodiments, the plurality of spatially separated independent touch elements comprises 10,000 or more independent touch elements, 50,000 or more independent touch elements, 100,000 or more independent touch elements, 500,000 or more independent touch elements, or 1,000,000 or more independent touch elements.

In certain embodiments, the one or more sensor-control signals comprise a touch sensor drive signal and a touch sensor sense signal.

In certain embodiments, each touch element comprises a touch analysis circuit that analyzes the sense signal to determine a touch.

In certain embodiments, the touch sensor is a capacitive touch sensor, an optical touch sensor, an acoustic touch sensor, an inductive touch sensor, a piezo-electric sensor, or a resistive touch sensor.

In certain embodiments, the touch sensor is a capacitive touch sensor and comprises one or more capacitors, each of the one or more capacitors connected to the touch controller of the respective touch element.

In certain embodiments, the capacitors are formed on the substrate.

In certain embodiments, the touch sensor is a self-capacitive touch sensor.

In certain embodiments, the touch sensor is a mutual-capacitive touch sensor having at least two electrical conductors.

In certain embodiments, the two electrical conductors are interdigitated.

In certain embodiments, the two electrical conductors are both electrically connected to a common touch controller of the plurality of touch controllers.

In certain embodiments, the two electrical conductors comprise a first electrical conductor electrically connected to a first touch controller of the plurality of touch controllers and a second electrical conductor different from the first electrical conductor electrically connected to a second touch controller of the plurality of touch controllers different from the first touch controller.

In certain embodiments, the first touch controller is connected to a first touch sensor of the plurality of touch sensors and to a second touch sensor of the plurality of touch sensors different from the first touch sensor.

In certain embodiments, the first and second touch sensors are arranged on opposite sides of the first touch controller.

In certain embodiments, the touch sensor is an optical touch sensor and the optical touch sensor comprises a light-sensitive semiconductor diode.

In certain embodiments, the touch elements are connected.

In certain embodiments, each touch element is connected to at least one neighboring touch element.

In certain embodiments, the touch elements each comprise a touch transmission circuit responsive to an interrogation signal from the system controller.

In certain embodiments, the touch elements each comprise a touch transmission circuit that independently provides a touch signal to the system controller.

In certain embodiments, at least some of the touch elements are connected in a row and column matrix.

In certain embodiments, at least a portion of the plurality of touch elements are connected in a daisy chain.

In certain embodiments, the substrate is a backplane substrate and the touch elements are disposed on one or more touch substrates different from the backplane substrate.

In certain embodiments, the substrate is a backplane substrate and wherein the touch controller circuits are disposed on one or more touch substrates different from the backplane substrate and the touch sensors are disposed on the backplane substrate.

In certain embodiments, the touch substrate is also a pixel substrate and the light-emitting pixels are located on the pixel substrate or comprising an active-matrix pixel controller circuit associated with each pixel and wherein the pixel controller circuit is located on the pixel substrate.

In certain embodiments, the substrate is a backplane substrate and comprising a pixel substrate different from the backplane substrate.

In certain embodiments, the light-emitting pixels are located on the pixel substrate.

In certain embodiments, the display includes an active-matrix pixel controller circuit associated with each pixel and wherein the pixel controller circuit is located on the pixel substrate.

In certain embodiments, the light-emitting pixels are located on the backplane substrate.

In certain embodiments, the each light-emitting pixel comprises one or more light emitters.

In certain embodiments, the light emitters comprise inorganic light emitting diodes.

In certain embodiments, each of the light emitters has a width from 2 to 5 µm, 5 to 10 µm, 10 to 20 µm, or 20 to 50 µm.

In certain embodiments, each of the light emitters has a length from 2 to 5 µm, 5 to 10 µm, 10 to 20 µm, or 20 to 50 µm.

In certain embodiments, each of the light emitters has with a height from 2 to 5 µm, 4 to 10 µm, 10 to 20 µm, or 20 to 50 µm.

In certain embodiments, the display substrate has a contiguous display substrate area, the plurality of light emitters each have a light-emissive area, and the combined light-emissive areas of the plurality of light emitters is less than or equal to one-quarter of the contiguous display substrate area.

In certain embodiments, the combined light-emissive areas of the plurality of light emitters is less than or equal to one eighth, one tenth, one twentieth, one fiftieth, one hundredth, one five-hundredth, one thousandth, one two-thousandth, or one ten-thousandth of the contiguous display substrate area.

In certain embodiments, the display has a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm.

In certain embodiments, display substrate has a transparency greater than or equal to 50%, 80%, 90%, or 95% for visible light.

In certain embodiments, the display substrate is a member selected from the group consisting of polymer, plastic, resin, polyimide, PEN, PET, metal, metal foil, glass, a semiconductor, and sapphire.

In another aspect, the disclosed technology includes a method of operating an active-matrix touchscreen, including: providing power and ground signals to an array of spatially separated independent touch elements disposed on a substrate, each touch element comprising a touch sensor and a touch controller circuit, wherein each touch sensor operates independently of any other touch sensor of the array of touch elements; for each of the touch controller circuits, independently providing one or more sensor-control signals to a respective touch sensor; and for each of the touch controller circuits, independently receiving a sense signal responsive to the one or more sensor-control signals from the touch sensor.

In certain embodiments, the method includes transmitting the sense signal to a system controller.

In certain embodiments, the method includes analyzing, by an independent touch analysis circuit in each touch element, the sense signal to determine a touch signal.

In certain embodiments, the method includes transmitting the touch signal to a system controller.

In certain embodiments, the method includes receiving an interrogation signal from a system controller.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which.

Figure 1:
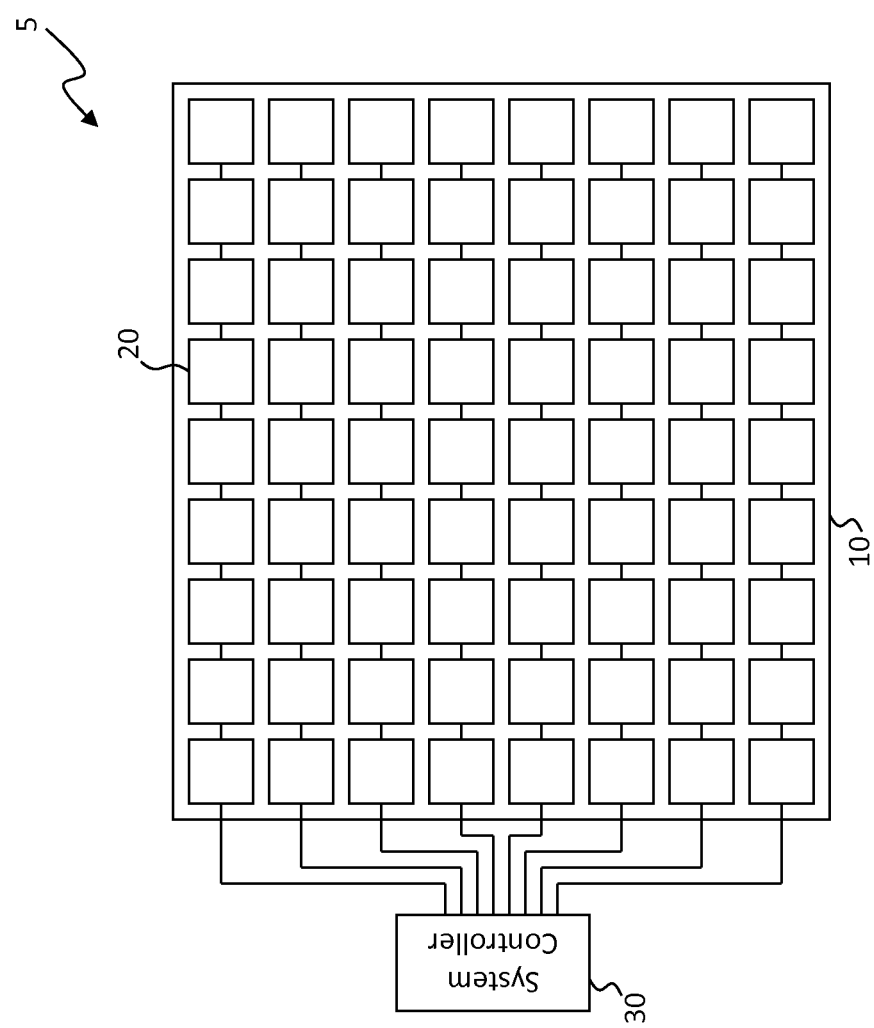
FIG. 1 is a schematic of an embodiment of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

Figure 2:
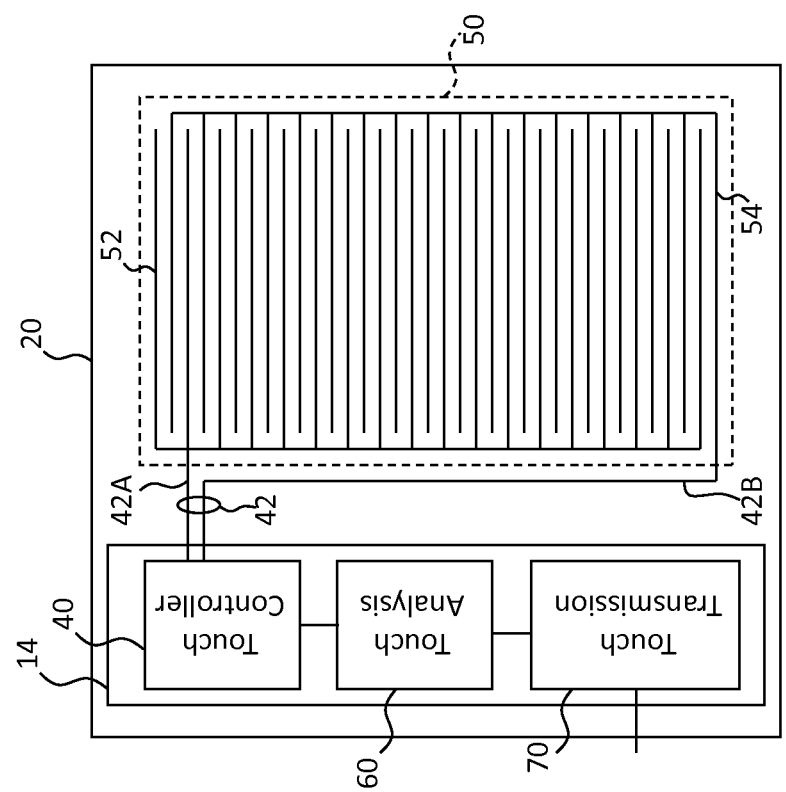
FIG. 2 is a schematic of a capacitive touch element according to an embodiment of the present invention.

Referring to the schematic of FIG. 1, in an embodiment of the present invention an active-matrix touchscreen 5 includes a substrate 10 and a system controller 30. The system controller 30 can be located on the substrate 10 or externally to it (as shown) and can, for example, be an integrated circuit. The system controller 30 can be a touch system controller or part of a display system controller, for example also controlling pixels in a display. A plurality of spatially separated independent touch elements 20 are disposed on or over the substrate 10, for example in a two-dimensional arrangement. Referring also to FIG. 2, each touch element 20 includes a touch sensor 50 and a touch controller circuit 40 that provides one or more sensor-control signals 42 to the touch sensor 50 and receives one or more sensor-control signals 42 from the touch sensor 50, for example a sense signal 42B responsive to a drive signal 42A. Each touch sensor 50 operates independently of any other touch sensor 50 and can be electrically independent of any other touch sensor 50. Likewise, in an embodiment, each touch controller circuit 40 can operate independently of any other touch controller circuit 40.

In an embodiment and referring back to FIG. 1, the touch elements 20 are connected, for example at least to one neighboring touch element 20 in either or both a row direction or a column direction. The touch elements 20 can be connected in a daisy chain (as shown) or in a row and column matrix (not shown). The touch elements 20 can communicate with each other or through each other and can communicate with the system controller 30, for example using touch transmission circuit 70 in each touch element 20. Thus, a touch element 20 can include touch transmission circuits 70 for receiving a communication from a first touch element 20 and communicating the communication to a second, different touch element 20.

The touch elements 20 can be interconnected in a variety of ways, for example in groups such as rows (as shown in FIG. 1), columns, rows and columns, or in rectangular subsets. The groups of touch elements 20 can be connected to the system controller 30 (for example in rows as shown in FIG. 1), or directly to the system controller 30. In an embodiment, each touch element 20 can independently and simultaneously detect a touch and transmit a touch signal to the system controller 30 in response to the detected touch.

In contrast to the present invention, prior-art touch controllers for a single-sensor touch area (for example resistive or acoustic touch sensors) typically can only detect a single touch at a time and thus do not have a plurality of independent touch elements 20 that can simultaneously detect a touch. Prior-art touch controllers for a multi-sensor touch area (for example self-capacitive or mutual-capacitive touch sensors) activate a row of touch sensors at a time and then read a sense signal from each of the columns. Because rows of sensors are activated together, they are not independent, even though each column provides a separate touch signal in response to the common row activation signal (for example such as a drive signal). Furthermore, according to prior-art schemes, since only one row can be activated at a time, the touch sensors in different rows cannot be activated at the same time and therefore the touch elements in different rows cannot detect a touch at the same time. Moreover, rows are typically sequentially activated so as to detect touches over an entire touch sensor array. This sequential row activation limits the response time of the entire array and hence the size or sensed touch rate of the touch screen. (As will be appreciated by those knowledgeable in the art, rows and columns can be interchanged in the present description and the present invention is not limited by the use of row or column descriptors.)

Thus, according to embodiments of the present invention, a two-dimensional arrangement of touch elements 20 has touch sensors 50 that operate independently of any other touch sensor 50 and touch controller circuits 40 that operate independently of any other touch controller circuit 40. The touch elements 20 can simultaneously detect multiple touches at different location on the substrate 10. To independently and simultaneously detect a touch means that every one of the touch elements 20 in the two-dimensional arrangement can independently detect a touch at the same time. Each of the touch elements 20 can activate a touch sensor 50 with the touch controller circuit 40 and can sense a touch sensor 50 response with the touch controller circuit 40 independently of any other touch element 20, at the same time, or at different times. The separate touch elements 20 can operate at different times, produce different results, and use separate control signals. In one embodiment, the touch controller circuit 40 of only one of the touch elements 20 activates a touch sensor 50 or senses a touch sensor 50 response at a time. In another embodiment, the touch controller circuits 40 of some but not all of the touch elements 20 activates a touch sensor 50 or senses a touch sensor response at a time. The some but not all of the touch elements 20 can include a random selection, complete rows, complete columns, partial rows, partial columns, or rectangular subsets that include only partial rows or partial columns or complete rows or complete columns of the two-dimensional arrangement of touch elements 20. In yet another embodiment, the touch controller circuits 40 of all of the touch elements 20 activate a touch sensor 50 or senses a touch sensor 50 response at a time. Furthermore, the touch controller circuits 40 of independent touch elements 20 can activate or sense touch sensors 50 independently of the system controller, 30 for example without requiring a control, activation, drive, or sense signal from the system controller 30.

In a further embodiment of the present invention, the touch elements 20 respond to an interrogation signal from the system controller 30 with a touch signal communicated by the touch transmission circuit 70. The interrogation signal can be supplied to a single touch element 20 or to multiple touch elements 20. The system controller 30, as shown in FIG. 1, can connect to multiple touch elements 20. The interrogation signal can be supplied to row(s), column(s), or rectangular subsets of touch elements 20. The interrogation signal can be sequentially supplied to subsets of touch elements 20 and groups of touch elements 20 can respond at the same time. Alternatively, the touch elements 20 can independently respond to the interrogation signal, for example with one response at a time. In another embodiment, the touch elements 20 can independently transmit a touch signal to the system controller 30 independently of any other touch element 20 and without responding to an interrogation signal, for example whenever a touch is detected by a respective touch element 20.

In a further embodiment of the present invention, the sensor-control signals 42 include a touch sensor drive signal 42A and a touch sensor sense signal 42B.

Furthermore, each touch element 20 can include a touch analysis circuit 60 that analyzes the sense signal 42B to determine a touch. The touch controller, touch analysis, and touch transmission circuits 40, 60, 70 can include means to drive a sensor at a desired rate, can measure a sensor signal (for example an electrical sense signal from the touch sensor 50), store a measured value in a memory, and can include means to compare a measured value with a stored value (for example with a comparator), as well as including digital circuits for enabling, clearing, or serially communicating signals or stored values. Such circuitry is known in the digital and analog circuit arts and can be integrated into an integrated circuit. Thus, the circuits in the touch elements 20, for example the touch controller circuit 40, the touch analysis circuit 60, and the touch transmission circuit 70 can be made in an integrated circuit. In some embodiments, the touch sensor 50 is made in an integrated circuit, in others it is formed on the substrate 10, or on another substrate.

The touch elements 20 can be dispersed or located on or over the substrate 10 or on or over layers formed on the substrate 10 and can be located in a regular or an irregular arrangement, for example a two-dimensional regular array (as shown in FIG. 1) or in an irregular arrangement (not shown). The plurality of spatially separated independent touch elements 20 can include 10,000 or more independent touch elements 20, 50,000 or more independent touch elements 20, 100,000 or more independent touch elements 20, 500,000 or more independent touch elements 20, or 1,000,000 or more independent touch elements 20. Because the present invention includes touch elements 20 that independently and simultaneously detect a touch, unlike prior-art touch systems, there is no logical limitation on the number of touch elements 20 that can be incorporated onto the substrate 10.

Figure 3:
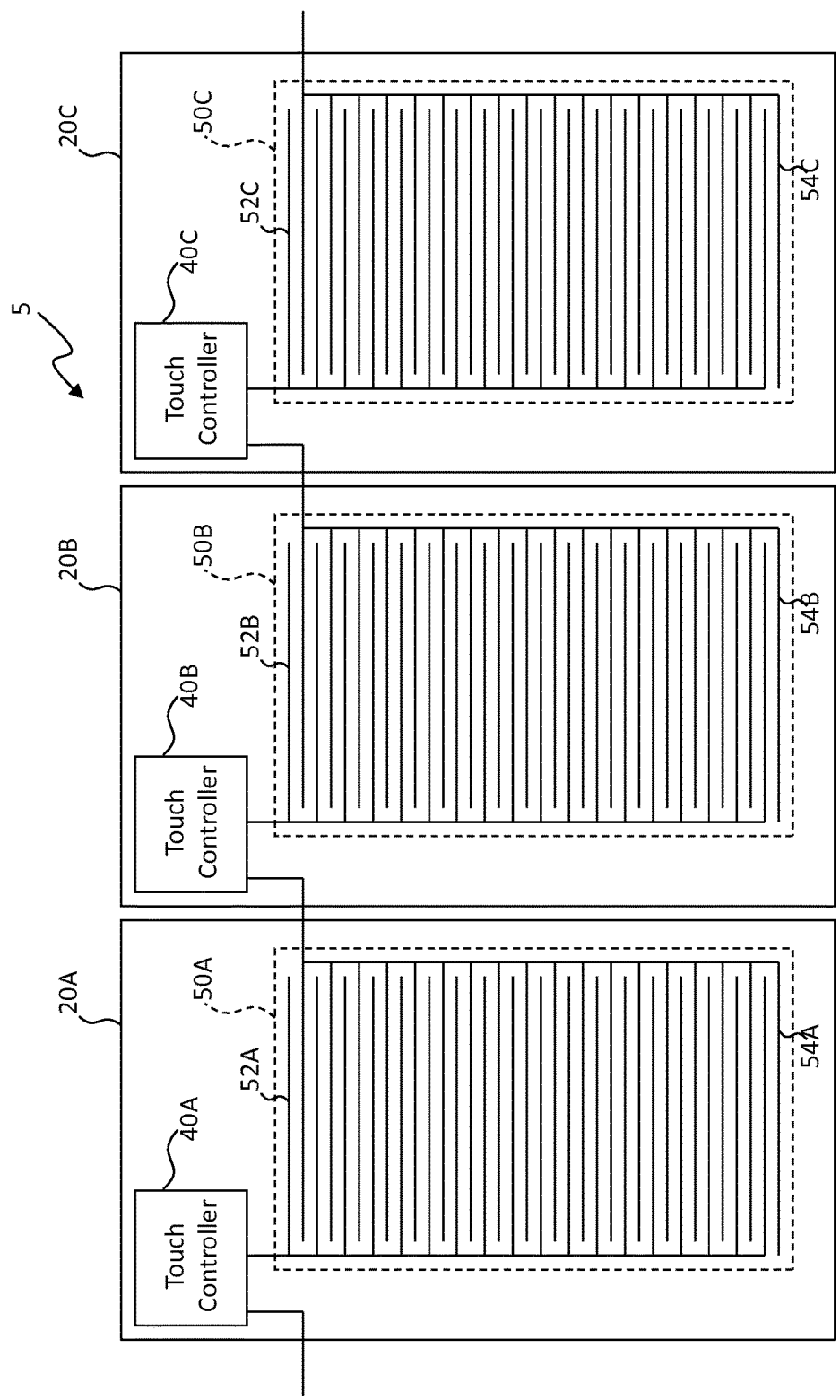
FIG. 3 is a schematic of a plurality of touch elements in an embodiment of the present invention.

In various embodiments of the present invention, the touch sensor 50 is a capacitive touch sensor, an optical touch sensor, an acoustic touch sensor, an inductive touch sensor, a piezo-electric sensor, or a resistive touch sensor. In an embodiment, the touch sensor 50 is a capacitive touch sensor 50 and includes one or more capacitors, each of which is connected to the touch controller circuit 40. In one embodiment of the present invention, the touch sensor 50 is a self-capacitive touch sensor. In another embodiment, the touch sensor 50 is a mutual-capacitive touch sensor having at least two electrical conductors that can be interdigitated as shown in FIG. 2 with first and second electrical conductors 52, 54 both electrically connected to a common touch controller circuit 40 of the plurality of touch controller circuits 40 with drive and sense signals 42A, 42B. In an alternative arrangement, shown in FIG. 3, the two electrical conductors include a first electrical conductor 52B electrically connected to a first touch controller circuit 40B in a touch element 20B having touch sensor 50B and a second electrical conductor 54B different from the first electrical conductor 52B electrically connected to a second touch controller circuit 40C different from the first touch controller circuit 40B in a touch element 20C having a different touch sensor 50C. Similarly, in touch element 20A, touch controller circuit 40A is connected to first electrical conductor 52A in touch sensor 40A and second electrical conductor 54A is connected to touch controller circuit 40B in touch element 20B. Thus, the first touch controller circuit 40B is connected to a first touch sensor 50B and to a second touch sensor 50A different from the first touch sensor 50B. In this embodiment, the first and second touch sensors 50B, 50A are arranged on opposite sides of the first touch controller circuit 40B.

Figure 4:
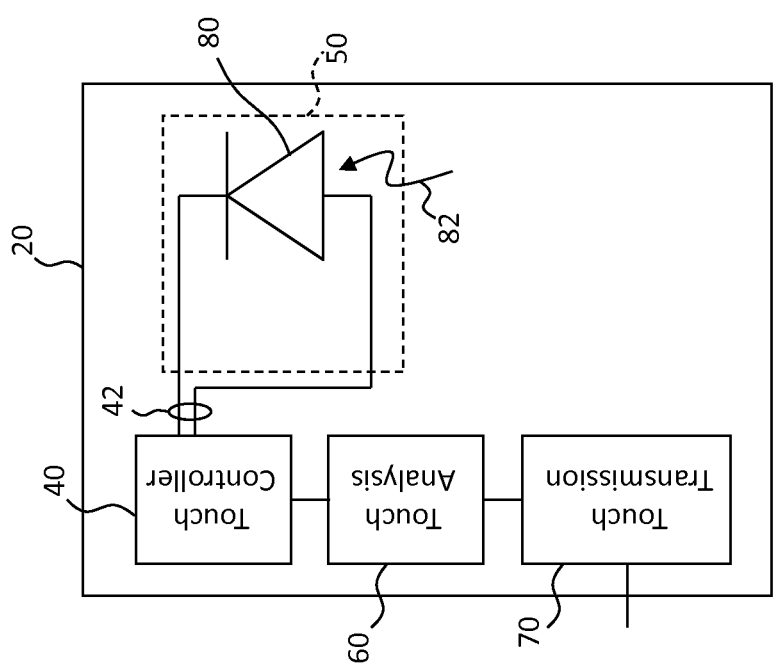
FIG. 4 is a schematic of an optical touch element according to an embodiment of the present invention.

Referring next to FIG. 4 in an alternative embodiment, the touch sensor 50 is an optical touch sensor 50 that includes a light-sensitive semiconductor diode 80 sensitive to light 82. In such an embodiment, a touch is detected by noting changes in the ambient light level resulting from obscuring light incident on the light-sensitive semiconductor diode 80.

The present invention can be constructed in a variety of ways. In a first way, the touch elements 20 are formed in or on the substrate 10 using photolithographic methods. In a second way, the substrate 10 is a backplane substrate 10 and the touch elements 20 are disposed on one or more touch substrates 14 separate and distinct from the backplane substrate 10. In such an embodiment, for example, the backplane substrate 10 can be glass, plastic, or metal and the touch substrate 14 can be a semiconductor substrate in which the touch controller circuit 40, the touch analysis circuit 60, and the touch transmission circuit 70 are formed and electrically interconnected for example using integrated circuit technologies and materials. The touch substrate 14 can be a crystalline semiconductor substrate having a much higher circuit performance than thin-film semiconductor layers formed on a glass, plastic or metal backplane substrate 10. In a third way, any of the touch controller circuit 40, the touch analysis circuit 60, and the touch transmission circuit 70 are formed in separate semiconductor substrates that are then individually located and interconnected on the backplane substrate 10, for example with photolithographically deposited and patterned metal traces. In a fourth way, each of the touch controller circuit 40, the touch analysis circuit 60, and the touch transmission circuit 70 are formed in two or more semiconductor substrates that are then individually located and interconnected on a separate touch substrate 14, for example made of the same material as the backplane substrate 10. The touch substrate 14 is then mounted and interconnected on the backplane substrate 10. Printed circuit board methods and materials (for example soldering) are useful in mounting and interconnecting multiple substrates on a backplane substrate 10. In any of these embodiments, the substrate 10 can consist of or include one or more of a polymer, plastic, resin, polyimide, PEN, PET, metal, metal foil, glass, a semiconductor, or sapphire. The substrate 10 can have a transparency greater than or equal to 50%, 80%, 90%, or 95% for visible light. The substrate 10 can have a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm and the active-matrix touchscreen 5 can have a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm.

In any of these ways, the touch sensor 50 can be formed on the backplane substrate 10 and connected to the touch controller circuit 40, whether the touch controller circuit 40 is formed in or on the backplane substrate 10 or on a separate touch substrate 14. For example, in an active-matrix touchscreen 5 having touch sensors 50 using capacitors, the capacitors can be constructed on the substrate 10 and have a size that is larger than the various control, analysis, and communication circuits. Alternatively, the touch sensor 50 is formed on a touch substrate 14 separate and distinct from the backplane substrate 10 and located and interconnected on the backplane substrate 10. The touch sensor 50 touch substrate 14 can be independent of any or all of the touch controller circuit 40, the touch analysis circuit 60, and the touch transmission circuit 70 or can be on a common substrate with any one, any combination of, or all of the touch controller circuit 40, the touch analysis circuit 60, and the touch transmission circuit 70. The use of a separate touch substrate 14 and any semiconductor substrates to form any of the touch controller circuit 40, the touch analysis circuit 60, or the touch transmission circuit 70 enhances performance and reduces circuit size because the semiconductor substrates can have a higher performance and denser circuitry than is available in thin-film semiconductor layers such as amorphous silicon layers or low-temperature polysilicon layers formed on, for example, glass substrates or photolithographic methods available for large substrates. The various elements and substrates can be provided using photolithographic methods and located on the backplane substrate 10 using, for example, micro-transfer printing or compound micro-transfer printing.

Figure 5:
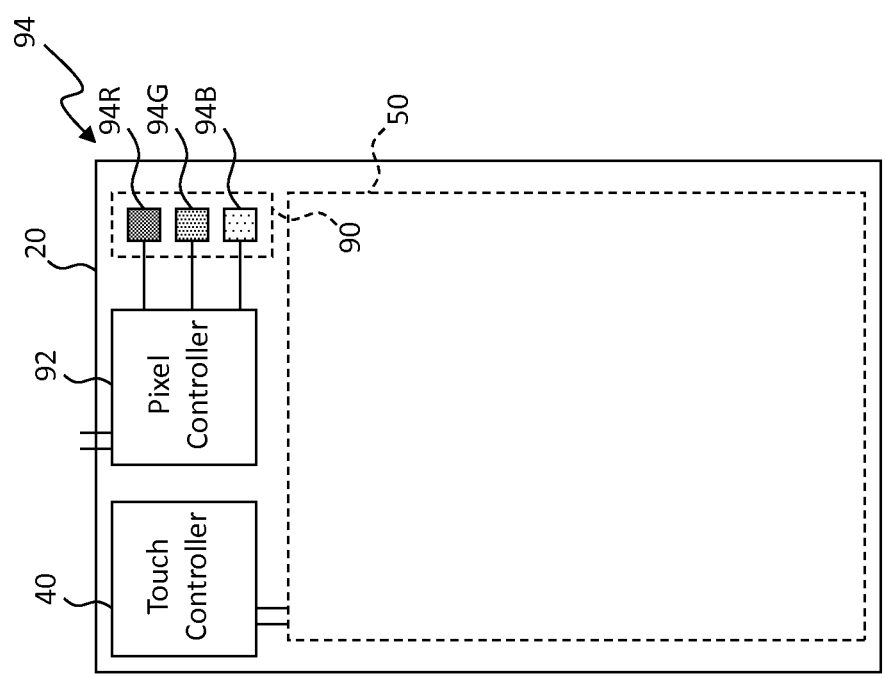
FIG. 5 is a schematic of a touch element incorporating light emitters according to an embodiment of the present invention.

In yet another embodiment shown in FIG. 5, the active-matrix touch screen includes one or more light emitters 94, for example a red light emitter 94R emitting red light, a green light emitter 94G emitting green light, and a blue light emitter 94B emitting blue light to form a full-color pixel 90. In an embodiment, the light emitters 94 are micro-LEDs and can have at least one of a length, width, or height from 2 to 5 µm, 4 to 10 µm, 10 to 20 µm, or 20 to 50 µm. A pixel controller 92 can control the light emitters 94 under the control of a display controller (not shown). As with the touch elements 20, the light emitters 94 or pixel controller 92 can be formed on the substrate 10 or provided in separate pixel substrates 16 (FIG. 6C) separate and distinct from the backplane substrate 10 and mounted on the backplane substrate 10. The light emitters 94 can each be formed in separate LED substrates that are each also separate and distinct from the pixel substrates 16, touch substrates 14, or backplane substrate 10 and mounted on or disposed on the pixel substrates 16 or backplane substrate 10. The pixel controller 92, and red, green, and blue light emitters 94R, 94G, 94B can each be provided in a separate pixel substrate 16 or in common with each other in various arrangements. Moreover, any of the pixel substrates 16 or touch substrates 14 can be common in various combinations. In particular, the pixel controller 92 can share a substrate with any of the touch controller circuit 40, the touch analysis circuit 60, and the touch transmission circuit 70.

Figure 6A:
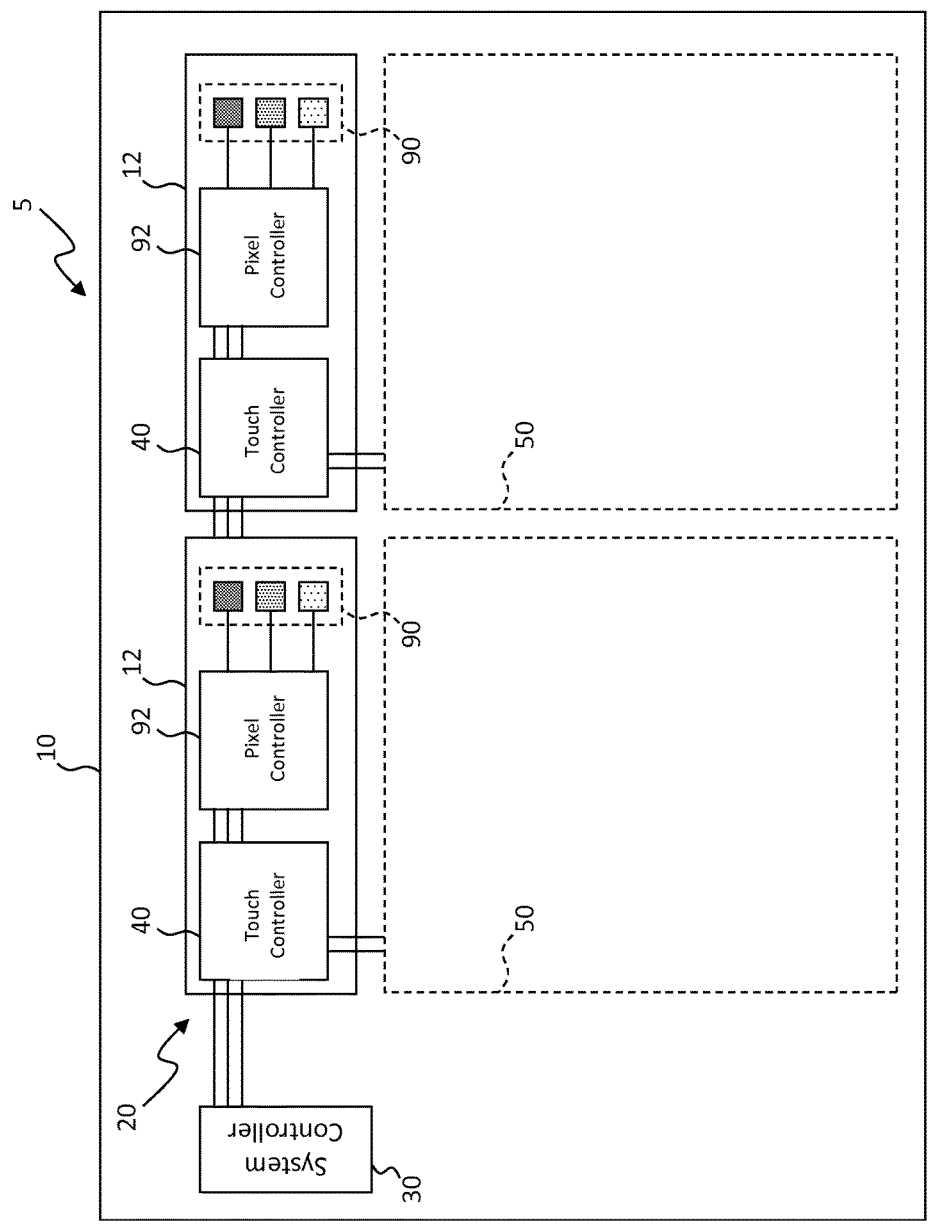
FIGS. 6A-6C are schematics of embodiments of the present invention including pixel or touch substrates.
Figure 6B:
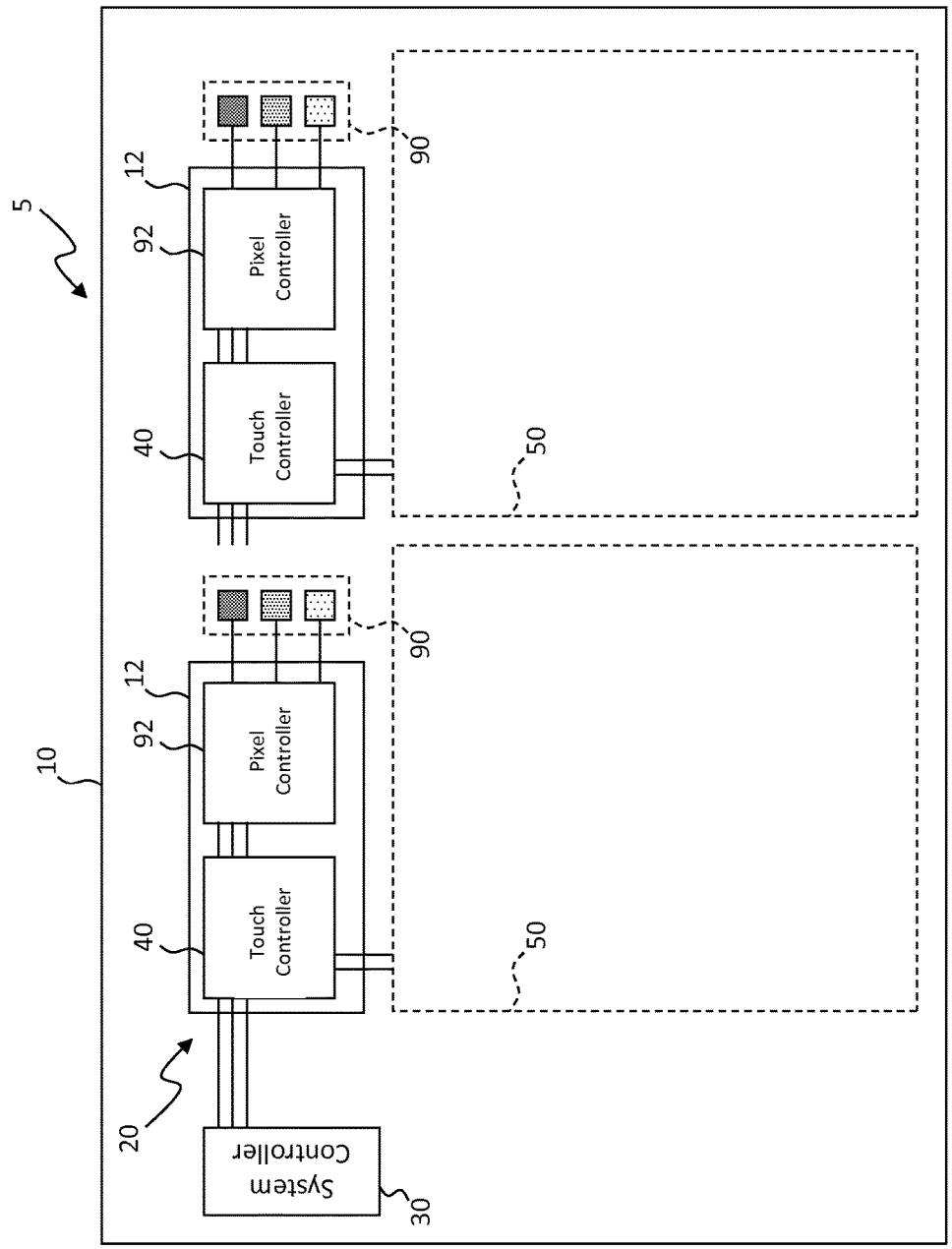

In an example embodiment of an active-matrix touchscreen 5 illustrated in FIG. 6A, a system controller 30 is mounted on a display substrate 10. Touch sensors 50 are formed or otherwise disposed on the display substrate 10. Pixel/touch substrates 12 separate and distinct from the display substrate 10 are disposed on the display substrate 10 and electrically interconnected with the touch sensors 50 (and power and ground signals, not shown). Each of a red, green, and blue micro-LED forming a full-color pixel 90 is formed in a separate LED substrate and disposed adjacent to the pixel/touch substrate 12 on the substrate 10 and electrically connected to the pixel/touch substrate 12. Each pixel/touch substrate 12 is interconnected with a neighboring pixel/touch substrate 12 and includes a touch controller circuit 40 and a pixel controller 92 to control the touch sensor 50 and the LEDs. (Touch analysis and touch transmission circuits 60, 70 can be included in the touch/pixel substrate 12 but, for clarity, are not shown). In an alternative embodiment, the touch controller circuit 40 and the pixel controller 92 are formed in or on a separate touch substrate 14 and pixel substrate 16, respectively, as illustrated in FIG. 6B. In yet another embodiment shown in FIG. 6C, the red, green, and blue micro-LEDs are mounted on the pixel substrate 16. Such a display structure can be formed using micro-transfer techniques, for example using a multi-step transfer or assembly process. By employing such a multi-step transfer or assembly process, increased yields are achieved and thus reduced costs for the active-matrix touchscreen 5 of the present invention. A discussion of compound micro-assembly structures and methods is provided in U.S. Patent Application Ser. No. 62/055,472 filed Sep. 25, 2014, entitled Compound Micro-Assembly Strategies and Devices.

The embodiments illustrated in FIGS. 5 and 6A-6C can be used to construct a display by disposing a plurality of the illustrated touch elements 20 and light emitters 94 together with pixel controllers 92 over the substrate 10. The light emitters 94 can be bottom emitters and the substrate 10 transparent to the light emitted by the light emitters 94. Alternatively, the light emitters 94 can be top emitters and the substrate 10 opaque. The light emitters 94 and pixel controllers 92 can be interspersed between the touch elements 20. In one embodiment, the same number of touch elements 20 and full-color pixels 90 are provided; in another embodiment fewer touch elements 20 than full-color pixels 90 are provided.

Thus, in an embodiment of the present invention, a display incorporating an active-matrix touchscreen 5 includes a substrate 10, a system controller 30, and a plurality of spatially separated independent light-emitters disposed on or over the substrate 10, for example arranged in a two-dimensional array. A plurality of spatially separated independent touch elements 20 is also disposed on or over the substrate 10. The touch elements 20 can be interspersed between the light-emitting full-color pixels 90 over the substrate 10. Each touch element 20 includes a touch sensor 50 and a touch controller circuit 40 that provides one or more sensor-control signals 42 such as a drive signal 42A to the touch sensor 50 and receives a sense signal 42B responsive to the sensor-control signals 42 from the touch sensor 50. As described, each touch sensor 50 operates independently of any other touch sensor 50 to provide a multi-touch active-matrix touchscreen-and-display system.

In an embodiment, any of the light emitters 94, a pixel controller 92, or any portion of the touch elements 20 are formed directly on the substrate 10. In a further embodiment, the substrate 10 is a backplane substrate 10 and the light emitters 94 or pixel controller 92 are provided on a pixel substrate 16 separate and distinct from the backplane substrate 10. In another embodiment, portions of the touch element 20 such as the touch controller circuit 40, the touch analysis circuit 60, the transmission circuit 70, or the touch sensor 50 are provided on a touch substrate 14 separate and distinct from the pixel substrate 16 or the backplane substrate 10. In another embodiment, portions of the touch element 20 such as the touch controller circuit 40, the touch analysis circuit 60, the transmission circuit 70, or the touch sensor 50 are provided on the touch substrate 14, the pixel substrate 16 or a combined pixel/touch substrate 12. Additional details useful in understanding and performing aspects of the present invention are described in U.S. patent application Ser. No. 14/754,573 filed Jun. 29, 2015, entitled Small Aperture Ratio Display with Electrical Component and U.S. patent application Ser. No. 14/743,981 filed Jun. 18, 2015 and entitled Micro-Assembled Micro LED Displays and Lighting Elements.

Thus, in an embodiment of the present invention, an integrated display includes a substrate 10, a plurality of light emitters 94 disposed on the substrate 10 and a plurality of touch sensors 50 disposed exclusively on the substrate 10. By exclusively disposed on the substrate 10 is meant that none of the light emitters 94 or touch sensors 50 are located or formed on another substrate that extends over the entire display area (where the display area is the contiguous area of the substrate 10 that includes all of the light emitters 94). LEDs or touch sensors formed on a native substrate different from the display substrate 10 and transferred, for example by micro-transfer printing, onto the non-native display substrate 10 are disposed on the substrate 10.

In certain embodiments, the LEDs are formed on or in a native substrate different from the display substrate 10 and then integrated on an intermediate pixel, touch, or combined pixel/touch substrate 16, 14, 12 and then transferred as part of the intermediate substrate, for example by micro-transfer printing, onto the non-native display substrate 10 are also disposed on the substrate 10. A discussion of compound micro-assembly structures and methods is provided in U.S. Patent Application Ser. No. 62/055,472 filed Sep. 25, 2014, entitled Compound Micro-Assembly Strategies and Devices.

Figure 6C:
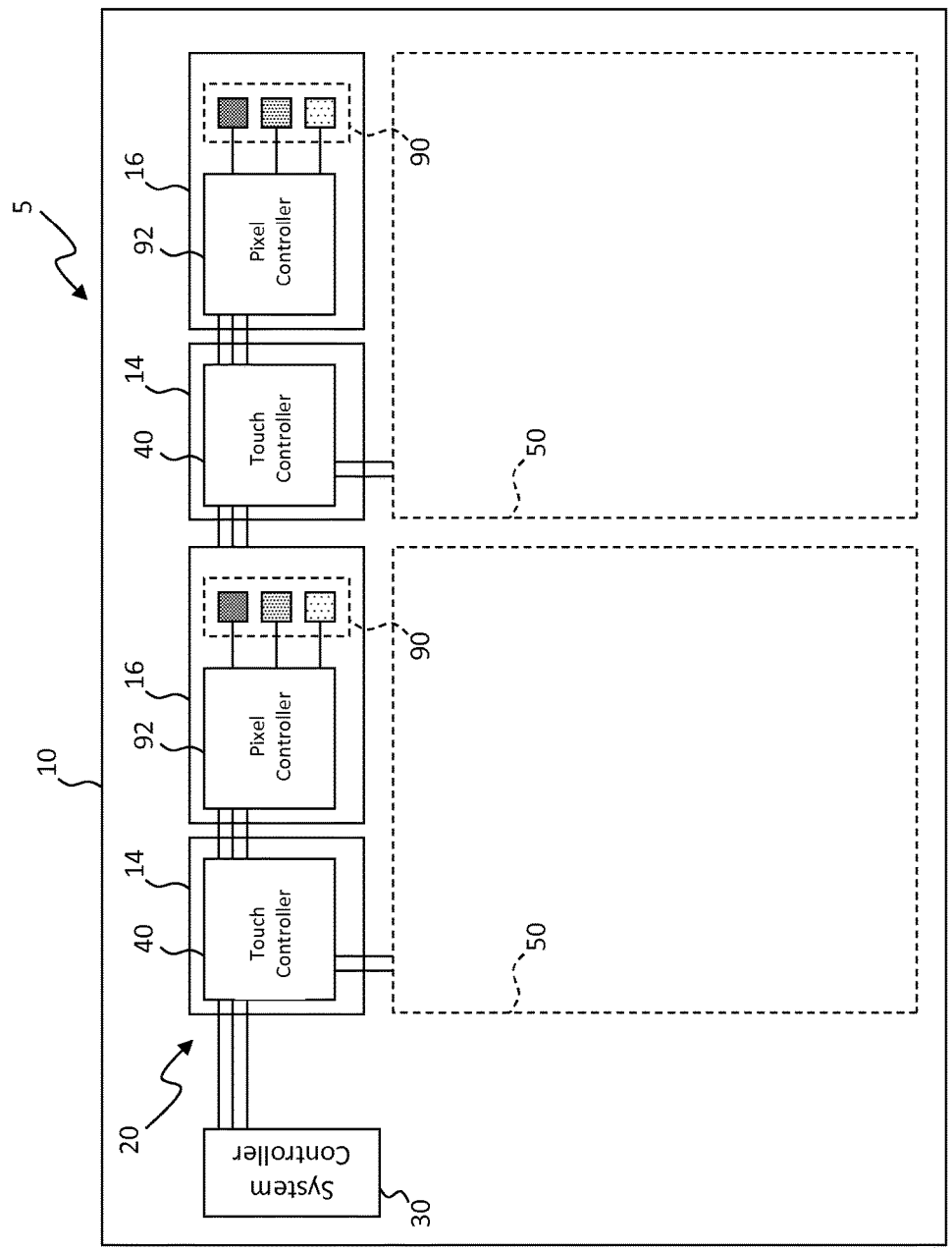

In certain embodiments, touch sensors 50 formed on the substrate 10 are also disposed exclusively on the substrate 10. Thus, in an embodiment, the touch sensors 50 are in or on a common plane with the light emitters 94 so that the touch sensors 50 do not absorb light emitted by the light emitters 94 and are not located between the light emitters 94 and a touchscreen user or display viewer, for example as illustrated in FIGS. 6A-6C. Such an arrangement of touch sensors 50 and light emitters 94 improves the light output of the display by preventing the touchscreen from absorbing light emitted by the light emitters 94.

In a further embodiment of the present invention, one or more of the touch sensors 50 are interspersed between the light emitters 94 over the substrate 10 in the display area. Furthermore, an array of touch controller circuits 40 can be disposed over the substrate 10. Each touch controller circuit 40 is associated with, connected to, and controls one or more of the touch sensors 40.

In operation, external power and ground signals (not shown) are provided to the array of touch elements 20. Each touch controller circuit 40 repeatedly and independently provides drive signals 42A to a corresponding touch sensor 50 and receives or detects sense signals 42B in response that indicate a touch or no-touch. The sensor-control signals 42 are analyzed, for example using the touch analysis circuit 60. Such a circuit can store sensed signals either as an analog value or as a digitized value, and then compare the stored sense signals to sense signals obtained at a later moment in time to detect changes in the touch sensor 50 sensor signals 42B indicative of a touch, for example changes in an electrical sense signal representing capacitance or ambient light. If a meaningful change is noted, the touch transmission circuit 70 communicates the touch to the system controller 30.

Figure 9:
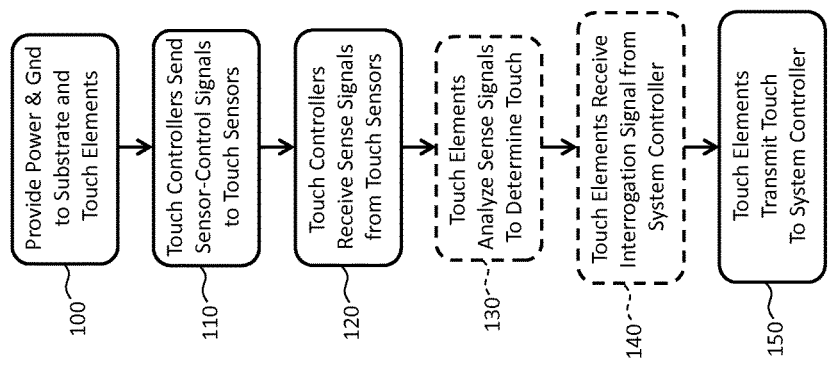
FIG. 9 is a flow diagram illustrating a method of the present invention.

Thus, in an embodiment of the present invention and referring to FIG. 9, a method of operating an active-matrix touchscreen 5 includes providing power and ground signals to an array of spatially separated independent touch elements disposed over a substrate in step 100. In certain embodiments, each touch element includes a touch sensor and a touch controller circuit. As discussed above, each touch sensor can operate independently of any other touch sensor of the array of touch elements. In step 110, each of the touch controller circuits 40 independently provides one or more sensor-control signals to the touch sensors 50. Thereafter, in step 120 each of the touch controller circuits 40 independently receives a sense signal responsive to the one or more sensor-control signals from the touch sensor 50. The sense signal, or a determined touch signal, is transmitted to the system controller 30 in step 150.

In optional step 130, the touch elements analyze sense signals to determine whether a touch has taken place and, if a touch is determined to have taken place, a touch signal is generated and transmitted to the system controller 30 in step 150. In optional step 140, an interrogation signal is received from the system controller 30 and, if a touch has taken place, the touch signal is transmitted to the system controller 30 in step 150.

Figure 7:
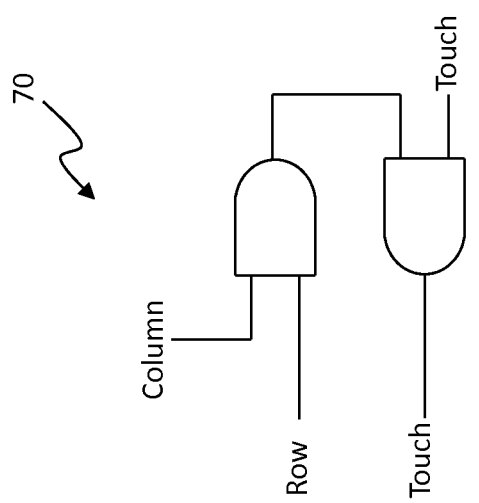

In one embodiment, the system controller 30 interrogates each of the touch elements 20 in turn, for example by interconnecting them with a row-column matrix electrode structure. Referring to FIG. 7, if the touch transmission circuit 70 of a touch element 20 receives a high signal from both a row and a column electrode and a touch is present at the touch element 20, a touch signal is returned. If any of the three signals are not present, no touch signal is returned. The system controller 30 receives the touch signal, or not, and then interrogates another touch element 20. The interrogation of each touch element 20 is completely independent of any other touch element 20 and the touch elements 20 can be interrogated in any order or frequency, for example touch elements 20 in the center of the two-dimensional array of touch elements 20 can be interrogated more frequently than other touch elements 20 on the periphery of the two-dimensional array of touch elements 20. The touch signal at the touch element 20 can be left valid until the touch is removed so that the touch element 20 can be repeatedly interrogated and transmits a touch signal. Alternatively, the combination of the row and column electrode interrogation signals (the AND combination of the row and column signals) can be used to clear the touch signal at the touch element 20. Alternatively, the system controller 30 can use any interrogation signal desired, including a direct connection to each individual touch element 20 or multiple groups of matrix-addressed subsets of touch elements 20, obviating the need for row and column matrix-addressed interrogation signals. The system controller 30 can include multiple circuits or connections to enable multiple touch elements 20 to report simultaneously, for example by subsets such as rows or columns.

Figure 8:
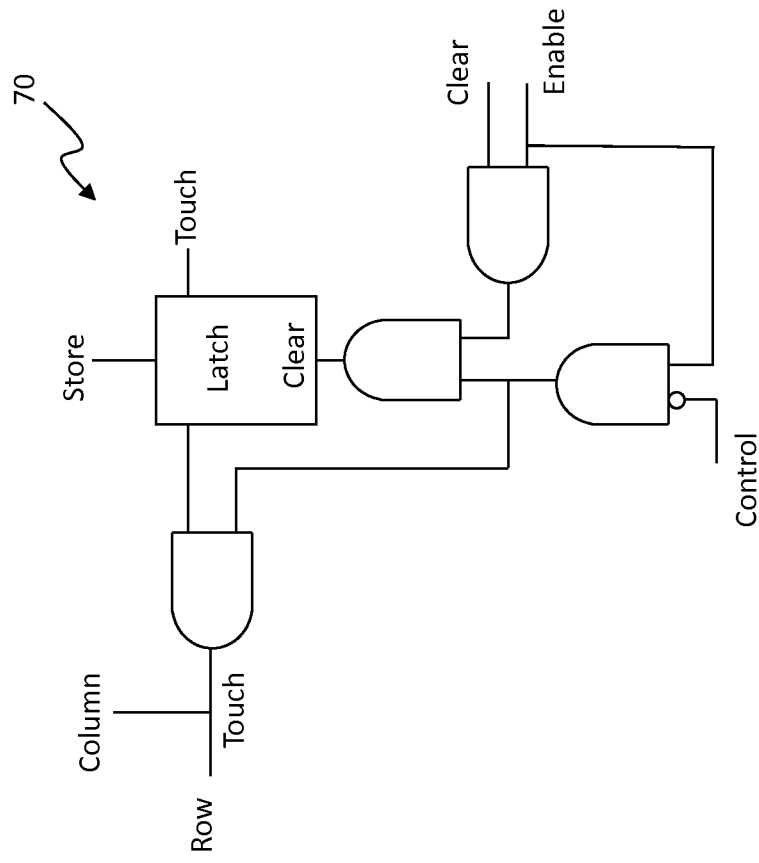
FIGS. 7 and 8 are schematic circuit diagrams of control circuits according to embodiments of the present invention.

Referring to FIG. 8, in another embodiment the system controller 30 does not interrogate the touch elements 20 but rather receives and responds to touch signals independently provided by the touch elements 20. For example, the touch controller circuit 40 of each touch element 20 independently and separately drives each touch sensor 50 with the drive signal 42A and receives a sense signal 42B that is analyzed by the touch analysis circuit 60. When a touch is detected the touch transmission circuit 70 of each independent touch element 20 receives a touch signal that is stored in a latch, for example using a local store signal (e.g., derived from a locally generated clock or a clock that is broadcast to all of the touch elements 20 in the array of touch elements 20) and a local enable signal brought high to indicate that a touch is present. A control signal from the system controller 30 indicates whether another touch element 20 is communicating (for example using an OR function of the row and column touch signals). If another touch element 20 is communicating, the output AND gate is not enabled and the touch transmission circuit 70 does not indicate a touch on the row and column address lines. If another touch element 20 is not communicating, the control line is low and the touch output enabled if a touch is present and stored in the latch. The system controller 30 will receive the row and column signals that indicate the address of the touch in the array and raise the control flag. When the row and column signals are properly stored in the system controller 30, the control signal is brought low again and in response a local clear signal is brought high to clear the latch and reset the local touch element 20 system.

Although the FIG. 8 circuit provides an address with a row and column signal, other schemes are possible. For example a direct connection can be provided to the system controller 30, obviating the need for the control signal. Alternatively, multiple control signals could be unique to a subset of touch elements 20 (for example a row or column) enabling a touch element 20 in each subset to report at the same instant. The system controller 30 can include multiple circuits or connections to enable multiple touch elements 20 to report simultaneously, for example by subsets such as rows or columns.

In another embodiment, referring back to FIG. 1, the touch elements 20 are connected in rows of daisy-chained touch elements 20. Each chain of touch elements 20 can simultaneously and serially communicate down the respective row and the touch transmission circuits 70 in each touch element 20 receives and transmits signals from its neighbors in the row, eventually passing the information to the system controller 30. Thus, the system controller 30 can receive touch information from every row at the same time. Chains can include single rows or columns or multiple rows or columns, increasing the data rate (or reducing response time) and reducing the connections required. Digital logic circuits suitable for the embodiments of FIGS. 7 and 8 or for daisy-chained control and communications as shown in FIG. 1 can be made in integrated circuits using photolithographic methods known in the art. Small integrated circuits can be micro transfer printed to the substrate 10 to provide the desired functionality disposed over the substrate 10. For example, the spatially separated independent touch elements 20 can be disposed on the substrate 10 via micro transfer printing. Known methods of patterning substrates 10 with electrical conductors (for example using micro-wires) are available.

Because the touch elements 20 of the present invention include active elements such as transistors, storage, or control elements, an active-matrix touchscreen 5 of the present invention is not limited to a data rate limited by sequential scanning rates, since all of the touch elements are operating simultaneously and independently. This attribute of present invention enables larger touchscreens or touchscreens with greater resolution, or both. In an embodiment of the present invention, the plurality of touch elements 20 have a resolution of greater than or equal to 10 touch sensors per inch, greater than or equal to 20 touch sensors per inch, greater than or equal to 50 touch sensors per inch, greater than or equal to 75 touch sensors per inch, greater than or equal to 100 touch sensors per inch, greater than or equal to 200 touch sensors per inch, or greater than or equal to 400 touch sensors per inch and least one dimension of the touch sensors 50 over the substrate 10 is less than or equal to 0.1 inches, 0.08 inches, 0.06 inches, 0.05 inches, 0.033 inches, 0.025, 0.020, 0.015, or 0.01 inches. Alternatively, at least two orthogonal dimensions of the touch sensors are both less than or equal to 0.1 inches, 0.08 inches, 0.06 inches, 0.05 inches, 0.033 inches, 0.025, 0.020, 0.015, or 0.01 inches. Likewise, at least one dimension of the substrate area over which the touch sensors 50 are disposed is greater than or equal to 10 inches, 12 inches, 15 inches, 20 inches, 24 inches, 32 inches, 44 inches, 55 inches, 65 inches, 72 inches, 80 inches, 100 inches, or 110 inches.

In a further embodiment of the present invention, the touch elements 20 include storage elements that provide double-buffered circuitry to communicate a touch to the system controller 30 and simultaneously sense a second touch at the same time with the touch controller circuit 40 and the touch sensor 50. Thus, the touch elements 20 are continuously available to both sense touches and communicate touches.

The circuit diagrams provided in FIGS. 6 and 7 are illustrative. Other circuit designs accomplishing the same tasks are readily apparent to skilled circuit designers and can include more sophisticated communication and control functions.

As is understood by those skilled in the art, the terms "over", "under", "above", "below", "beneath", and "on" are relative terms and can be interchanged in reference to different orientations of the layers, elements, and substrates included in the present invention. For example, a first layer on a second layer, in some embodiments means a first layer directly on and in contact with a second layer. In other embodiments, a first layer on a second layer can include another layer there between.

Having described certain embodiments, it will now become apparent to one of skill in the art that other embodiments incorporating the concepts of the disclosure may be used. Therefore, the invention should not be limited to the described embodiments, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST 5 active-matrix touchscreen
10 substrate/display substrate/backplane substrate
12 pixel/touch substrate
14 touch substrate
16 pixel substrate
20, 20A, 20B, 20C touch element
30 system controller
40, 40A, 40B, 40C touch controller circuit
42 sensor-control signals
42A drive signal
42B sense signal
50, 50A, 50B, 50C touch sensor
52, 52A, 52B, 52C first electrical conductor
54, 54A, 54B, 54C second electrical conductor
60 touch analysis circuit
70 touch transmission circuit
80 light-sensitive semiconductor diode
82 light
90 full-color pixel
92 pixel controller
94 light emitters
94R red light emitter
94G green light emitter
94B blue light emitter
100 provide power and ground signals to substrate and touch elements step
110 touch controller circuits send sensor-control signals to touch sensors step
120 touch controller circuits receive sense signals from touch sensors step
130 touch elements analyze sense signals to determine touch step
140 touch elements receive interrogation signal from system controller step
150 touch elements transmit touch so system controller step

What is claimed:
1. A display, comprising:
a substrate;
a plurality of inorganic light-emitting diodes disposed exclusively on and in contact with the substrate; and
a plurality of touch sensors exclusively on and in contact with the substrate, wherein the plurality of inorganic light-emitting diodes and the plurality of touch sensors are disposed on a common surface of the substrate, wherein the touch sensors are interspersed between the inorganic light-emitting diodes over the substrate, and wherein each touch sensor comprises a control circuit for controlling the touch sensor and the control circuits are interspersed between the inorganic light-emitting diodes over the substrate.

2. The display of claim 1, comprising:

a system controller; and a plurality of touch controller circuits, each touch controller circuit associated with a touch sensor and disposed on the substrate for providing one or more sensor-control signals to the touch sensor and for receiving a sense signal responsive to the one or more sensor-control signals from the touch sensor, wherein each touch sensor operates independently of any other touch sensor of the plurality of touch elements, each touch controller circuit and associated touch sensor forming a touch element.

3. The display of claim 2, wherein the touch sensor is a capacitive touch sensor and comprises one or more capacitors, each of the one or more capacitors connected to the touch controller circuit of the respective touch element.

4. The display of claim 3, wherein the one or more capacitors are formed on the substrate.

5. The display of claim 3, wherein the touch sensor is a self-capacitive touch sensor.

6. The display of claim 3, wherein the touch sensor is a mutual-capacitive touch sensor having at least two electrical conductors.

7. The display of claim 2, wherein the touch sensor is a capacitive touch sensor, an optical touch sensor, an acoustic touch sensor, an inductive touch sensor, a piezo-electric sensor, or a resistive touch sensor.

8. The display of claim 2, wherein the substrate is a backplane substrate and the touch controller circuits are formed in or on one or more touch substrates different from the backplane substrate and the touch substrates are disposed on the backplane substrate, or wherein the substrate is a backplane substrate and the touch controller circuits are formed in or on the backplane substrate.

9. The display of claim 1, wherein the touch sensor is a capacitive touch sensor, an optical touch sensor, an acoustic touch sensor, an inductive touch sensor, a piezo-electric sensor, or a resistive touch sensor.

10. The display of claim 1, wherein the touch sensor is an optical touch sensor and the optical touch sensor comprises a light-sensitive semiconductor diode.

11. The display of claim 1, wherein the area over the substrate of each touch sensor is larger than the area over the substrate of each inorganic light-emitting diode.

12. The display of claim 1, wherein the substrate is a backplane substrate and the control circuits are formed in or on one or more touch substrates different from the backplane substrate and the touch substrates are disposed on the backplane substrate, or wherein the substrate is a backplane substrate and the control circuits are formed in or on the backplane substrate.

* * * * *